United States Patent
Lin et al.

(10) Patent No.: US 7,781,898 B2
(45) Date of Patent: Aug. 24, 2010

(54) IC PACKAGE REDUCING WIRING LAYERS ON SUBSTRATE AND ITS CHIP CARRIER

(75) Inventors: Hung-Tsun Lin, Tainan (TW); Wu-Chang Tu, Tainan (TW); Cheng-Ting Wu, Tainan (TW)

(73) Assignee: Chipmos Technologies Inc., Hsinchu (TW)

( * ) Notice: Subject to any disclaimer, the term of this patent is extended or adjusted under 35 U.S.C. 154(b) by 126 days.

(21) Appl. No.: 11/806,023

(22) Filed: May 29, 2007

(65) Prior Publication Data

US 2008/0174031 A1   Jul. 24, 2008

(30) Foreign Application Priority Data

Jan. 24, 2007   (TW) ................ 96102754 A

(51) Int. Cl.
*H01L 23/48* (2006.01)
(52) U.S. Cl. ............. 257/784; 257/E23.01; 257/786; 257/737; 257/738; 257/778; 257/698; 257/696
(58) Field of Classification Search ............ 257/784, 257/E23.01, 786, 737, 738, 778, 698, 696
See application file for complete search history.

(56) References Cited

U.S. PATENT DOCUMENTS

| | | | |
|---|---|---|---|
| 6,078,500 A * | 6/2000 | Beaman et al. | 361/704 |
| 6,127,724 A * | 10/2000 | DiStefano | 257/675 |
| 6,291,898 B1 | 9/2001 | Yeh et al. | |
| 6,429,515 B1 | 8/2002 | Glenn | |
| 6,940,182 B2 | 9/2005 | Hilton et al. | |
| 7,064,426 B2 * | 6/2006 | Karnezos | 257/686 |
| 7,088,009 B2 * | 8/2006 | Hagen | 257/786 |
| 7,105,930 B2 | 9/2006 | Lua et al. | |
| 7,112,886 B2 * | 9/2006 | Chang | 257/774 |

(Continued)

FOREIGN PATENT DOCUMENTS

CN   1414821 A   4/2003

(Continued)

OTHER PUBLICATIONS

Office Action dated May 6, 2010 for 0992030589001 which is a corresponding Taiwanese application that cites US7105930, US6291898, US6429515, US6940182, and TWM267628.

(Continued)

*Primary Examiner*—Alexander O Williams
(74) *Attorney, Agent, or Firm*—WPAT, P.C.; Anthony King

(57) ABSTRACT

An IC package primarily comprises a substrate, a die-attaching layer, a chip, at least a bonding wire, and a plurality of electrical connecting components. The substrate has a top surface and a bottom surface where the top surface includes a die-attaching area for disposing the die-attaching layer. The chip is attached to the die-attaching area by the die-attaching layer and is electrically connected to the substrate by the electrical connecting components. Both ends of the bonding wire are bonded to two interconnecting fingers on the top surface of the substrate where at least a portion of the bonding wire is encapsulated in the die-attaching layer to replace some wirings or vias inside a conventional substrate. Therefore, the substrate has simple and reduced wiring layers, i.e., to reduce the substrate cost. A chip carrier of the corresponding IC package is also revealed.

11 Claims, 4 Drawing Sheets

U.S. PATENT DOCUMENTS

| | | | |
|---|---|---|---|
| 7,429,786 B2 * | 9/2008 | Karnezos et al. | 257/686 |
| 2008/0113472 A1 * | 5/2008 | Tung et al. | 438/114 |
| 2008/0157360 A1 * | 7/2008 | Lua et al. | 257/737 |

FOREIGN PATENT DOCUMENTS

| TW | M267628 | 6/2005 |
|---|---|---|

OTHER PUBLICATIONS

Office Action dated Apr. 10, 2009 for 2007100969693 which is a corresponding Chinese application that cites CN1414821A and US7112886.

Office Action dated Jul. 31, 2009 for 2007100969693 which is a corresponding Chinese application that cites CN1414821A and US7112886.

* cited by examiner

IC PACKAGE REDUCING WIRING LAYERS ON SUBSTRATE AND ITS CHIP CARRIER

FIELD OF THE INVENTION

The present invention relates to IC chip packages, specially, to IC packages with reducing wiring layers of substrate.

BACKGROUND OF THE INVENTION

In IC packages, multi-layer substrates are widely implemented for chip carriers and for electrical connections. However, the substrate cost is about 30% of the overall package cost, especially, the substrate cost increases as the wiring layers increase.

As shown in FIG. 1, a conventional IC package 100 primarily comprises a substrate 110, a die-attaching layer 120, a chip 130, and a plurality of electrical connecting components 140. The substrate 100 has a top surface 111, a bottom surface 112, and a plurality of inner fingers 113 disposed on the top surface 111. A back surface 132 of the chip 130 is attached to the top surface 111 of the substrate 110 by the die-attaching layer 120. A plurality of bonding pads 133 are disposed on an active surface 131 of the chip 130 where the bonding pads 133 of the chip 130 are electrically connected to the inner fingers 113 of the substrate 110 by the electrical connecting components 140 such as bonding wires. An encapsulant 150 is formed on the top surface 111 of the substrate 110 to encapsulate the chip 130 and the electrical connecting components 140. The IC package 100 further comprises a plurality of external terminals 160 disposed on the bottom surface 112 of the substrate 110 for external electrical connections. Before packaging, the substrate 100 must have complete all of wiring layers with corresponding vias, therefore, the substrate cost cannot be effectively reduced.

SUMMARY OF THE INVENTION

The main purpose of the present invention is to provide an IC package and its chip carrier where both ends of bonding wire(s) bonded on the substrate to replace parts of the wiring circuits or/and the vias of a conventional substrate so that the wiring layers of the substrate can be reduced or simplified to reduce the substrate cost.

The second purpose of the present invention is to provide an IC package and its chip carrier with interconnecting bonding wire(s) bonded on the substrate before encapsulation.

The third purpose of the present invention is to provide an IC package to avoid the IC chip contacting the bonding wire(s) with two ends bonded on the substrate.

According to the present invention, an IC package primarily comprises a substrate, a die-attaching layer, a chip, at least a bonding wire, and a plurality of electrical connecting components. The substrate has a top surface and a bottom surface and further has at least a first interconnecting finger and at least a second interconnecting finger which are disposed on the top surface. Furthermore, a die-attaching area is defined on the top surface where the die-attaching layer is formed on the die-attaching area on the top surface of the substrate. The chip is disposed on the top surface of the substrate and aligned with the die-attaching area by the die-attaching layer. The first interconnecting finger is electrically connected to the second interconnecting finger by the bonding wire. The electrical connecting components electrically connect the chip to the substrate where at least a portion of the bonding wire is encapsulated in the die-attaching layer. Moreover, a chip carrier composed of the substrate, the die-attaching layer, and the bonding wires mentioned above is also revealed.

DETAIL DESCRIPTION OF THE INVENTION

Please refer to the attached drawings, the present invention will be described by means of embodiment(s) below.

Figure 1:
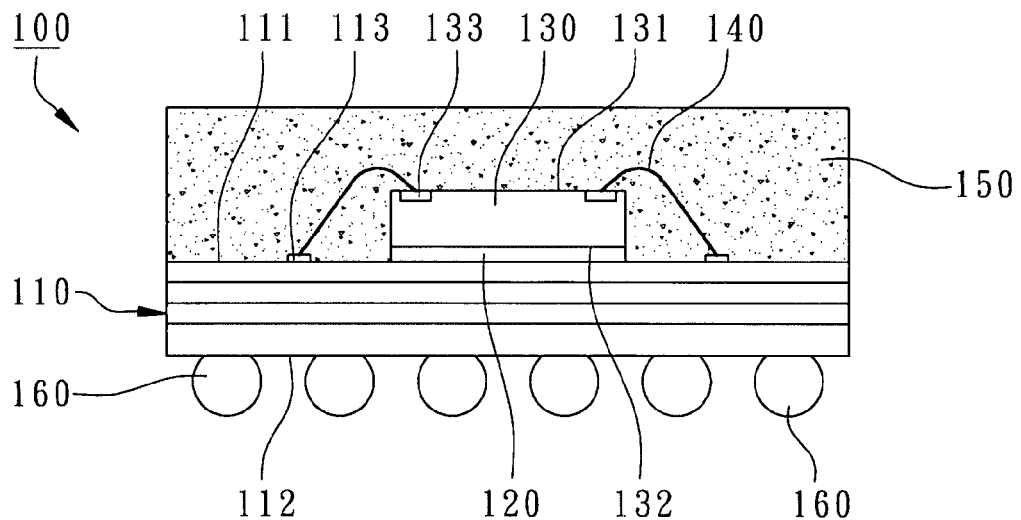
FIG. 1 shows a cross sectional view of a conventional IC package.
Figure 2:
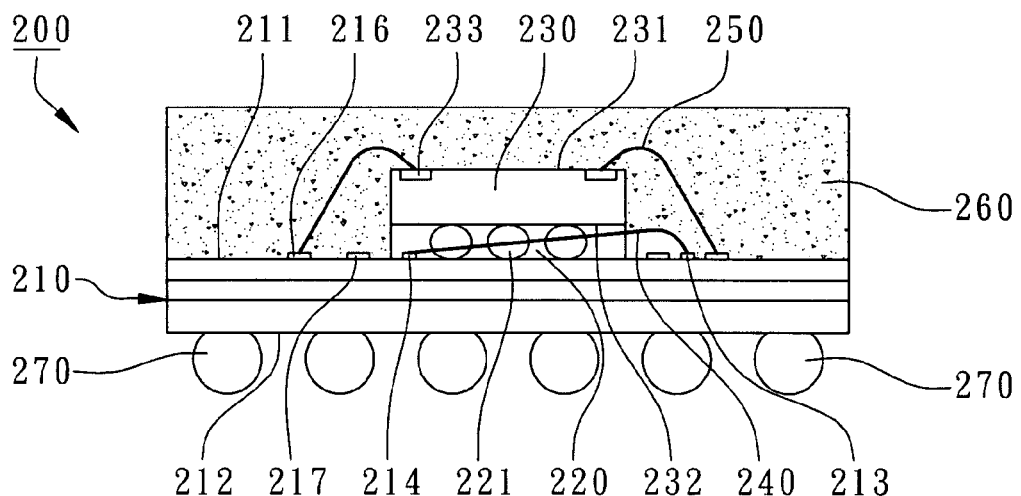
FIG. 2 shows a cross sectional view of an IC package according to the first embodiment of the present invention.
Figure 3:
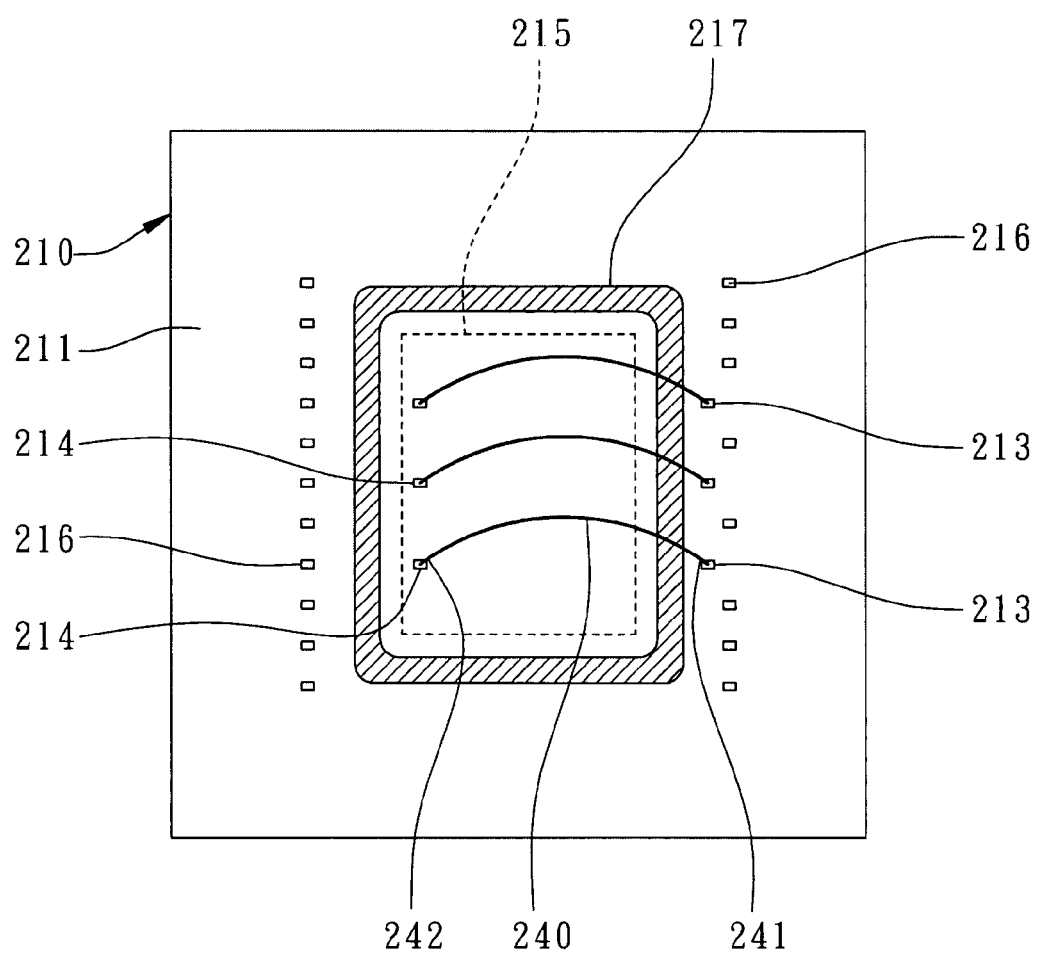
FIG. 3 shows a top view of a substrate of the IC package before die attachment according to the first embodiment of the present invention.

According to the first embodiment of the present invention, as shown in FIG. 2, an IC package 200 primarily comprises a substrate 210, a die-attaching layer 220, a chip 230, at least a bonding wire 240, and a plurality of electrical connecting components 250. The substrate 210 has a top surface 211 and a bottom surface 212 where at least a first interconnecting finger 213, at least a second interconnecting finger 214, and a plurality of inner fingers 216 are disposed on the top surface 211. Moreover, the top surface 211 includes a die-attaching area 215 which is defined for disposing the die-attaching layer 220. As shown in FIG. 3, in this embodiment, the first interconnecting finger 213 and a plurality of inner fingers 216 are disposed outside the die-attaching area 215 and the second interconnecting finger 214 is disposed inside the die-attaching area 215. The bonding wire 240 is formed by wire-bonding technology and has a ball bond 241 and a wedge bond 242 where the ball bond 241 is bonded at the first interconnecting finger 213 and the wedge bond 242 at the second interconnecting finger 214 so that the maximum loop peak of the bonding wire 240 is located outside the die-attaching area 215. The substrate 210 further has a ground ring 217 formed between the first interconnecting fingers 213 and the second interconnecting fingers 214 on the top surface 211 and encircled the die-attaching area 215. The bonding wire 240 overpasses the ground ring 217 to electrically connect the first interconnecting finger 213 and the second interconnecting finger 214 so that the bonding wire 240 can serve as internal electrical connections for the substrate 210. In the present embodiment, the substrate 210 can be a multi-layer printed circuit board, some wiring traces or/and vias can be replaced by the bonding wire 240.

The die-attaching layer 220 is formed on the die-attaching area 215 on the top surface 211 of the substrate 210. The die-attaching layer 220 may be selected from the group consisting of resin containing spacer balls with equal diameters, B-stage resin, adhesive film, epoxy, non-conductive paste or liquid paste to attach the chip 230. Preferably, the die-attaching layer 220 is a resin containing spacer balls with equal diameters to keep a constant gap between the chip 230 and the substrate 210 and to ensure that the back surface 232 of the chip 230 will not directly contact the bonding wire 240.

As shown in FIG. 2, the chip 230 has an active surface 231 and a corresponding back surface 232 where a plurality of bonding pads 233 are formed on the active surface 231, the back surface 232 of the chip 230 is attached to the top surface 211 of the substrate 210 by the die-attaching layer 220. In addition, the chip 230 is aligned with the die-attaching area 215.

The first interconnecting finger 213 is electrically connected to the second interconnecting finger 214 by the bonding wire 240 where the first interconnecting finger 213 is located outside the die-attaching area 215 and the second interconnecting finger 214 inside the die-attaching area 215. The bonding wire 240 has a ball bond 241 and a wedge bond 242 where the ball bond 241 is bonded to the first interconnecting finger 213 and the wedge bond 242 to the second interconnecting finger 214. Accordingly, a portion of the bonding wire 240 is encapsulated in the die-attaching layer 220. In the present embodiment, the bonding wire 240 with reduced loop peak does not touch the back surface 232 of the chip 230.

The bonding pads 233 of the chip 230 are electrically connected to the inner fingers 216 of the substrate 210 by the electrical connecting components 250. In the present embodiment, the electrical connecting components 250 are a plurality of bonding wires formed by wire-bonding.

The IC package 200 further comprises an encapsulant 260 formed on the top surface 211 of the substrate 210 to encapsulate the chip 230 and the electrical connecting components 250. In the present embodiment, the encapsulant 260 further encapsulates the other portion of the bonding wires 240 exposed from the die-attaching layer 220. To be more specific, the IC package 200 further comprises a plurality of external terminals 270 which are disposed on the bottom surface 212 of the substrate 210 for external electrical connections. The external terminals 270 may be solder balls, solder paste, contact pads, or contact pins. In the present embodiment, the external terminals 270 are solder balls and the IC package 200 is a Ball Grid Array Package (BGA).

Therefore, the bonding wires 240 formed by the conventional wire bonders to replace parts of the wiring layers and vias inside a conventional substrate. Since the substrate 210 does not have a complete electrical transmission infrastructure, therefore, the wiring layers can be reduced, i.e., the substrate cost and thickness can also be reduced. Furthermore, a chip carrier composed of the substrate 210, the die-attaching layers 220, and bonding wires 240 is also revealed. In a different embodiment, the die-attaching layer 220 is a B-stage paste which becomes a non-adhesive film under room temperature for easy shipping and handling.

Figure 4:
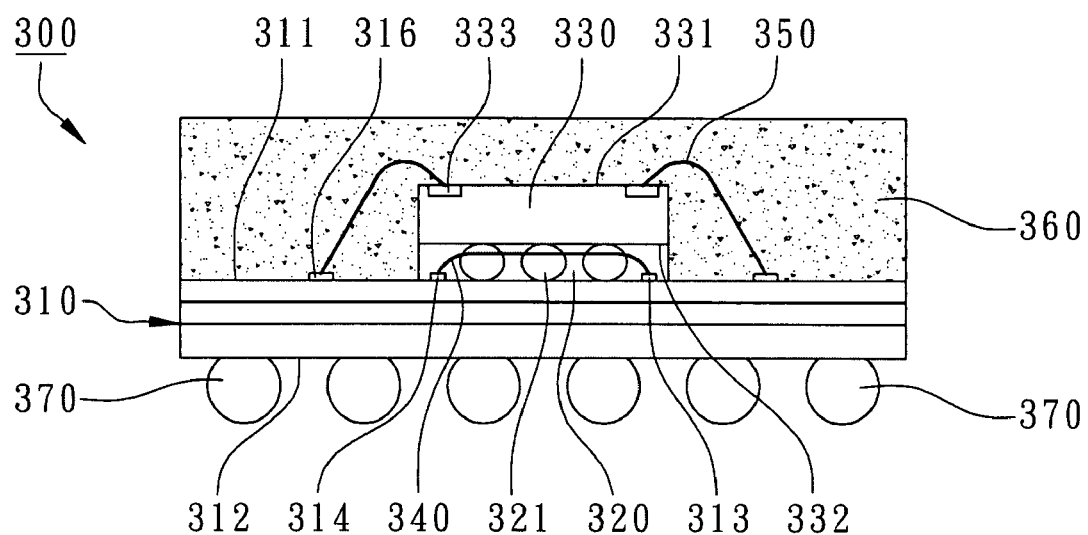
FIG. 4 shows a cross sectional view of an IC package according to the second embodiment of the present invention.
Figure 5:
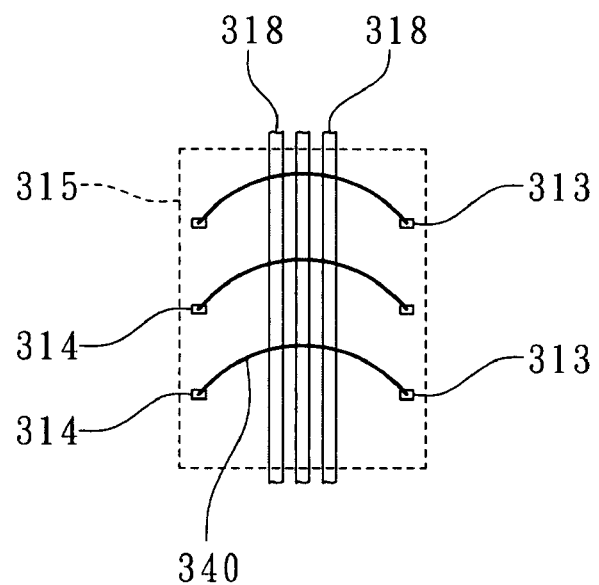
FIG. 5 partially shows a top view of a substrate of the IC package before die attachment according to the second embodiment of the present invention.

Another IC package is revealed in the second embodiment of the present invention, as shown in FIG. 4. An IC package 300 primarily comprises a substrate 310, a die-attaching layer 320, a chip 330, at least a bonding wire 340, and a plurality of electrical connecting components 350. The substrate 310 has a top surface 311 and a bottom surface 312 and further has at least a first interconnecting finger 313 and at least a second interconnecting finger 314 which are disposed on the top surface 311, moreover, a die-attaching area 315 is defined on the top surface 311 for disposing the die-attaching layer 320. As shown in FIG. 5, in the present embodiment, the first interconnecting finger 313 and the second interconnecting finger 314 are located inside the die-attaching area 315 to effectively utilize the no wiring area of the substrate 310. The substrate 310 further has at least one trace 318 formed on the top surface 311 between the first interconnecting finger 313 and the second interconnecting finger 314.

The die-attaching layer 320 is formed on the die-attaching area 315 on the top surface 311 of the substrate 310 where the die-attaching layer 320 comprises resin containing a plurality of spacer balls 321 with equal diameters. The back surface 332 of the chip 330 is attached to the top surface 311 of the substrate 310 by the die-attaching layer 320. In the present embodiment, the chip 330 has a plurality of bonding pads 333 formed on the active surface 331 of the chip 330.

As shown in FIG. 4, the first interconnecting finger 313 is electrically connected to the second interconnecting finger 314 by the bonding wires 340 over passing the trace 318. In addition, the bonding wire 340 is completely encapsulated by the die-attaching layer 320. The bonding pads 333 of the chip 330 are electrically connected to the inner fingers 316 of the substrate 310 by the electrical connecting components 350.

The IC package 300 further comprises an encapsulant 360 formed on the top surface 311 of the substrate 310 to encapsulate the chip 330 and the electrical connecting components 350. A plurality of external terminals 370 such as solder balls are disposed on the bottom surface 312 of the substrate 310 for external electrical connections.

Therefore, both ends of the bonding wires 340 are bonded on the substrate 310 to replace parts of the wiring traces or/and vias of a conventional substrate. After packaging processes, the substrate 310 will become a complete electrical connection infrastructure so that the wiring layers of the substrate 310 can be reduced and simplified to reduce the substrate cost.

Figure 6:
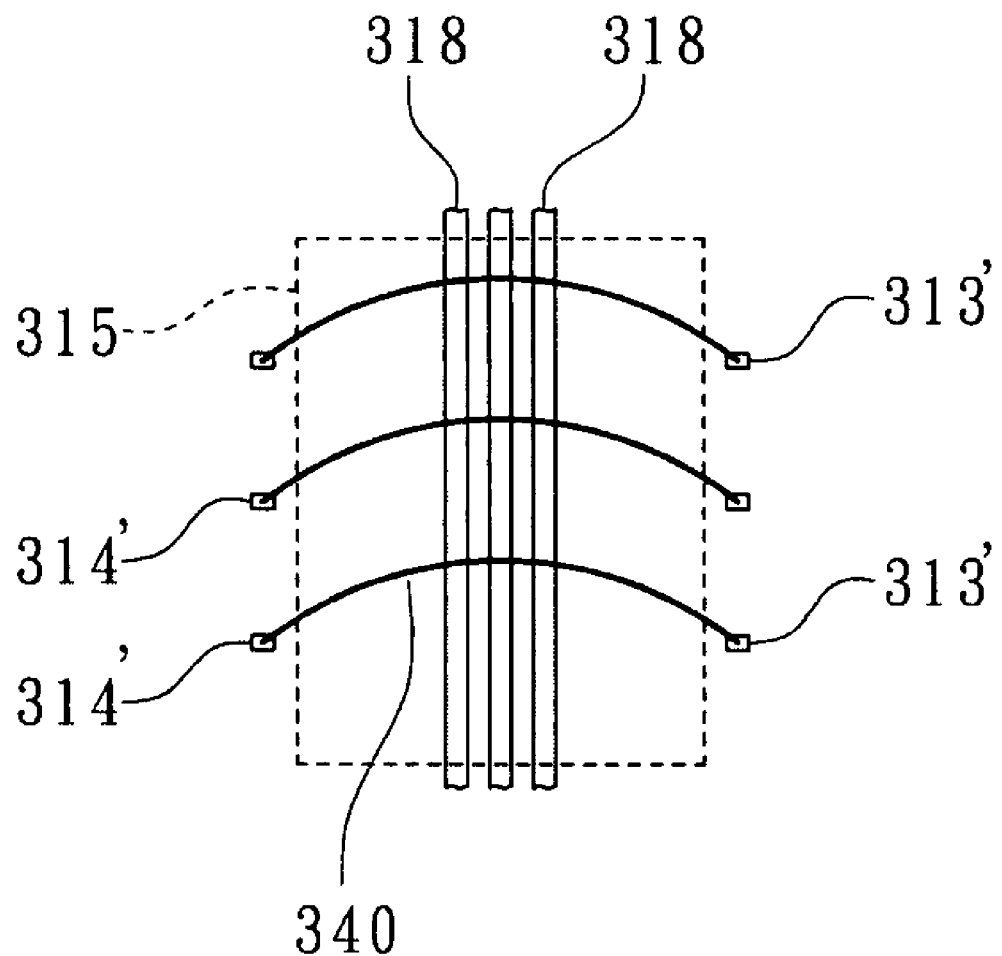
FIG. 6 partially shows a top view of another substrate of the IC package before die attachment according to the third embodiment of the present invention.

In the third embodiment, another IC package is revealed in FIG. 6 where the major components in the third embodiment are almost the same as the ones in the second embodiment, therefore, the figure labels will follow the ones of the second embodiment. At least a first interconnecting finger 313' and at least a second interconnecting finger 314' are disposed on the top surface 311 of the substrate 310. A die-attaching area 315' is defined on the top surface 311 of the substrate 310 for die attachment. In the present embodiment, the first interconnecting finger 313' and the second interconnecting finger 314' are located outside the die-attaching area 315. At least a trace 318 is disposed between the first interconnecting finger 313' and the second interconnecting finger 314' on the substrate 310. At least a bonding wire 340 connects the first interconnecting finger 313' and the second interconnecting finger 314' to provide the shortest electrical connection across the die-attaching area 315.

The above description of embodiments of this invention is intended to be illustrative and not limiting. Other embodiments of this invention will be obvious to those skilled in the art in view of the above disclosure.

What is claimed is:
1. An IC package comprising:
   a substrate having a top surface, a bottom surface, a first interconnecting finger and a second interconnecting finger disposed on the top surface, wherein the top surface includes a die-attaching area defined;
   a die-attaching layer formed on the die-attaching area on the top surface of the substrate;
   a chip disposed on the top surface of the substrate and aligned with the die-attaching area by the die-attaching layer;
   at least a bonding wire connecting the first interconnecting finger and the second interconnecting finger, and
   a plurality of electrical connecting components electrically connecting the chip to the substrate;
   wherein at least a portion of the bonding wire is encapsulated in the die-attaching layer; and wherein the first interconnecting finger is located outside the die-attaching area and the second interconnecting finger inside the die-attaching area, furthermore, the bonding wire has a ball bond and a wedge bond, wherein the ball bond is bonded on the first interconnecting finger and the wedge bond on the second interconnecting finger.

2. The IC package of claim 1, wherein the substrate further has a ground ring formed between the first interconnecting finger and the second interconnecting finger on the top surface of the substrate.

3. The IC package of claim 1, further comprising an encapsulant formed on the top surface of the substrate to encapsulate the chip, the electrical connecting components, and the other portion of the bonding wire exposed from the die-attaching layer.

4. The IC package of claim 1, wherein the die-attaching layer is a resin containing spacer balls with equal diameters.

5. The IC package of claim 1, further comprising a plurality of external terminals disposed on the bottom surface of the substrate.

6. The IC package of claim 1, wherein the electrical connecting components are a plurality of bonding wires formed by wire-bonding.

7. A chip carrier of an IC package comprising:
   a substrate having a top surface, a bottom surface, a first interconnecting finger and a second interconnecting finger disposed on the top surface, wherein the top surface includes a die-attaching area defined;
   a die-attaching layer formed on the die-attaching area on the top surface of the substrate; and
   at least a bonding wire connecting the first interconnecting finger and the second interconnecting finger;
   wherein at least a portion of the bonding wire is encapsulated in the die-attaching layer; and
   wherein the first interconnecting finger is located outside the die-attaching area and the second interconnecting finger inside the die-attaching area, furthermore, the bonding wire has a ball bond and a wedge bond, wherein the ball bond is bonded on the first interconnecting finger and the wedge bond on the second interconnecting finger.

8. The chip carrier of claim 7, wherein the substrate further has a ground ring formed between the first interconnecting finger and the second interconnecting finger on the top surface of the substrate.

9. The chip carrier of claim 7, wherein the die-attaching layer is a resin containing spacer balls with equal diameters.

10. The IC package of claim 1, wherein at least one bonding wire is arched and non-horizontal to the substrate.

11. The chip carrier of claim 7, wherein the at least one bonding wire is arched and non-horizontal to the substrate.

* * * * *